US009360895B2

(12) United States Patent
Shah et al.

(10) Patent No.: US 9,360,895 B2
(45) Date of Patent: Jun. 7, 2016

(54) ASSEMBLY AND METHOD FOR DISPLAY DEVICE MOUNTING

(71) Applicant: Panasonic Avionics Corporation, Lake Forest, CA (US)

(72) Inventors: Shrenik Shah, Laguna Niguel, CA (US); Chi-Wei Chou, Chino Hills, CA (US)

(73) Assignee: Panasonic Avionics Corporation, Lake Forest, CA (US)

( * ) Notice: Subject to any disclaimer, the term of this patent is extended or adjusted under 35 U.S.C. 154(b) by 310 days.

(21) Appl. No.: 14/103,647

(22) Filed: Dec. 11, 2013

(65) Prior Publication Data

US 2014/0198473 A1 Jul. 17, 2014

Related U.S. Application Data

(60) Provisional application No. 61/752,785, filed on Jan. 15, 2013.

(51) Int. Cl.
*G06F 1/16* (2006.01)
*B60R 11/02* (2006.01)
*F16M 11/04* (2006.01)
*F16M 13/02* (2006.01)
*H05K 7/12* (2006.01)
*B64D 11/00* (2006.01)
*B60R 11/00* (2006.01)

(52) U.S. Cl.
CPC .......... *G06F 1/1679* (2013.01); *B60R 11/0235* (2013.01); *B64D 11/00151* (2014.12); *F16M 11/041* (2013.01); *F16M 13/02* (2013.01); *H05K 7/12* (2013.01); *B60R 2011/0015* (2013.01); *Y10T 29/49826* (2015.01)

(58) Field of Classification Search
USPC ...................................... 361/679.41
IPC ....................................... G06F 1/1679
See application file for complete search history.

(56) References Cited

U.S. PATENT DOCUMENTS 5,684,673 A 11/1997 Shibasaki et al.
5,927,765 A 7/1999 Austin et al.
(Continued)

FOREIGN PATENT DOCUMENTS

EP 2 463 746 A2 6/2012

OTHER PUBLICATIONS

Extended European Search Report for Application No. 12199553.2-1751 / 2754610, Dated Oct. 1, 2014.

*Primary Examiner* — David Warren
(74) *Attorney, Agent, or Firm* — Brian Furrer

(57) ABSTRACT

An assembly for mounting a display device in a vehicle. The assembly includes a mounting plate having opposite edges, a front surface extending therebetween, and a rear surface opposite the front surface. The mounting plate is mountable to the vehicle with the front surface of the mounting plate facing outward. The assembly includes a first locking mechanism disposed proximate one edge of the mounting plate and a second locking mechanism disposed proximate the other edge. Each locking mechanism includes a jaw extending over the front surface of the mounting plate and pivotable between closed and open positions. Each jaw includes a resiliently deformable biasing member connected to the jaw and biasing the jaw towards the closed position. The assembly includes an electrical connector attached to the mounting plate. The electrical connector has an opening for mating with another connector.

16 Claims, 5 Drawing Sheets

(56) References Cited

U.S. PATENT DOCUMENTS

| | | | |
|---|---|---|---|
| 6,278,676 B1 | 8/2001 | Anderson | |
| 6,956,628 B2 | 10/2005 | Huang | |
| 7,492,587 B2 | 2/2009 | Chang | |
| 7,800,897 B2 | 9/2010 | Hung | |
| 8,782,714 B2 | 7/2014 | Bird et al. | |
| 2004/0179135 A1* | 9/2004 | Battles | H04N 1/00127 348/373 |
| 2005/0047081 A1* | 3/2005 | LaPorte | B60R 11/0252 361/679.41 |
| 2006/0047426 A1* | 3/2006 | Vitito | B60K 35/00 701/469 |
| 2006/0250531 A1 | 11/2006 | Hsu | |
| 2007/0169259 A1* | 7/2007 | Macey | A61H 33/60 4/541.1 |
| 2007/0224841 A1 | 9/2007 | Davis et al. | |
| 2011/0153150 A1* | 6/2011 | Drew | G07C 5/0808 701/31.4 |
| 2011/0263293 A1* | 10/2011 | Blake | B60K 35/00 455/557 |
| 2011/0267759 A1* | 11/2011 | Abram | B60R 11/0235 361/679.27 |
| 2012/0063081 A1* | 3/2012 | Grunwald | B60R 11/0235 361/679.41 |
| 2012/0120626 A1 | 5/2012 | Akaike | |
| 2012/0134102 A1* | 5/2012 | Sullivan | G06F 1/1616 361/679.43 |
| 2012/0145861 A1* | 6/2012 | Collins | B60R 11/02 248/274.1 |
| 2013/0006526 A1* | 1/2013 | Banus | G01C 21/3688 701/444 |
| 2014/0019401 A1* | 1/2014 | Boyer | B60K 35/00 706/47 |
| 2014/0285666 A1* | 9/2014 | O'Connell | B60R 1/00 348/148 |
| 2015/0120089 A1* | 4/2015 | Peel | B60T 7/16 701/2 |
| 2015/0192956 A1* | 7/2015 | Whorton | B01J 31/02 361/679.43 |

* cited by examiner

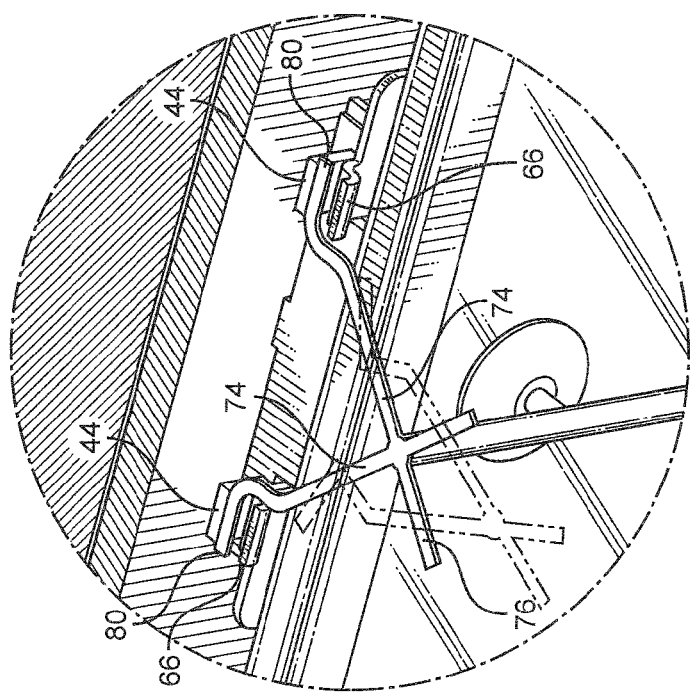
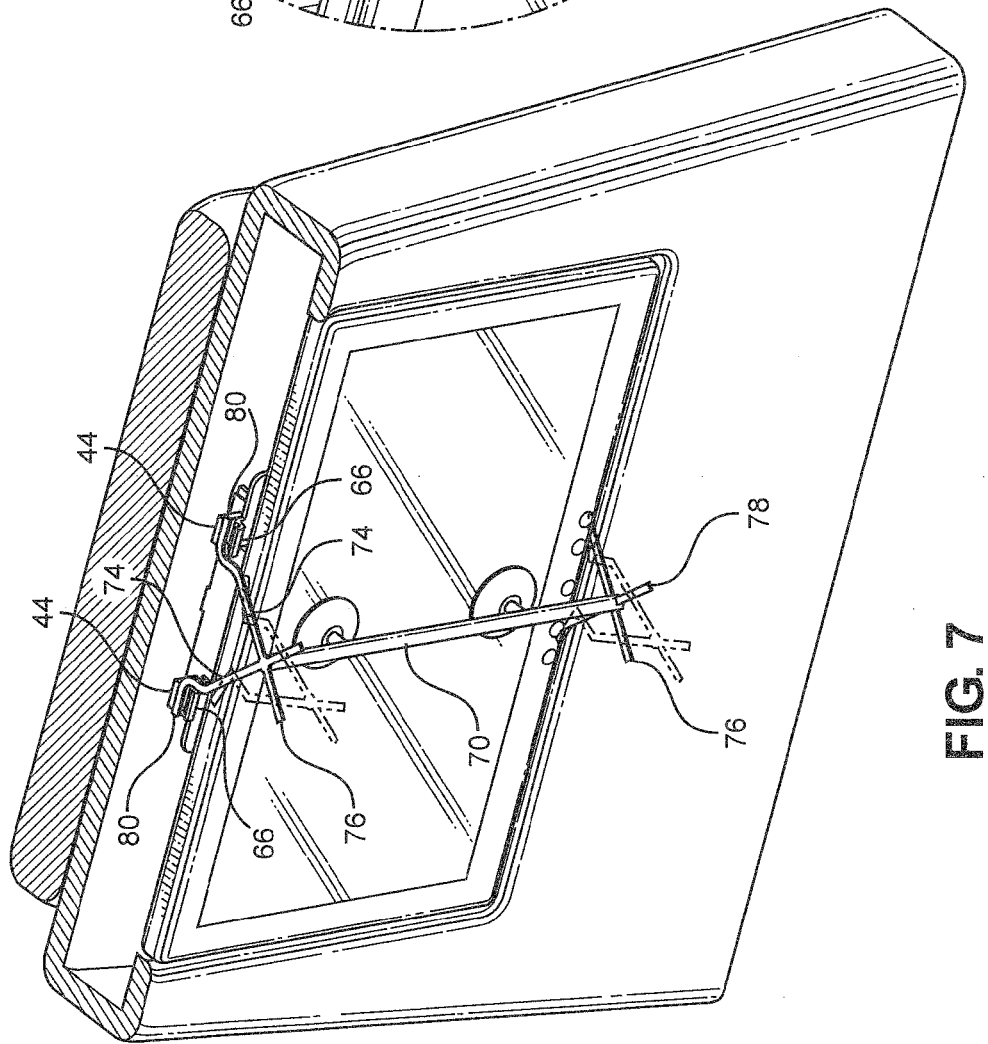

ASSEMBLY AND METHOD FOR DISPLAY DEVICE MOUNTING

CROSS-REFERENCE TO RELATED APPLICATIONS

This application claims priority form U.S. Provisional Patent Application No. 61/752,785, filed Jan. 15, 2013. Priority from the foregoing provisional application is expressly claimed and the disclosure thereof is incorporated herein by reference in its entirety and for all purposes.

TECHNICAL FIELD

The present invention relates generally to mounting assemblies for display devices in a vehicle passenger compartment in which the display devices are for reproducing digital information for users such as video, audio, text, and images, and in particular, to display devices having mounting assemblies that provide for detachable mounting arrangements.

BACKGROUND

Commercial passenger airlines typically arrange seats in rows to efficiently use the available space for passenger accommodation. The intended goal is to maximize the quantity of passengers that that the aircraft can carry per flight for economical use of the vehicle. In general, commercial passenger transport is a competitive business requiring efficient operation.

Frequently, commercial passenger airlines equip their aircraft with in-flight entertainment systems to relieve passenger boredom. In-flight entertainment systems are especially common on aircraft used for longer flight routes. In-flight entertainment systems often include a display device or monitor mounted on passenger seat backs. A passenger sitting in a seat facing the display device can use the display device to reproduce digital information such as video, audio, text, images, and more, depending on the in-flight entertainment system equipped with the aircraft.

In the past, display devices have been used that require partially disassembling a seat to mount the display device thereto. More particularly, the display devices required attachment to mounting points on internal seat structure and attachment to an electrical harness in the seat. Once mounted, the display device is supported by the internal seat structure with the display portion of the device exposed from the seatback for viewing by a passenger. At least one prior art arrangement requires inserting the display device through the front of the back support of a seat to mount the monitor.

The advantage of the foregoing prior arrangements is that the display devices mount very securely to internal seat structure. The seats on passenger aircraft are designed to withstand several gravities in a sudden deceleration event and the display devices are attached to the internal seat supporting structure. If there is a sudden deceleration event, the display devices are securely held and do not usually detach from the seatback in a sudden deceleration event. In addition, it prevents unauthorized tampering as passengers cannot easily detach a display device.

While the foregoing arrangement provides for secure mounting of a display, there are drawbacks. The major drawback is that it is labor intensive and time consuming to mount the display device in this manner. It requires significant time to disassemble each seat, fasten a display device to the internal mounting points and connect an electrical harness to the display device. It can be very time consuming to initially equip an aircraft with such display devices as larger commercial passenger aircraft have hundreds of seats. Further, it is labor intensive and time consuming to repair or replace defective display devices after they have been installed.

As discussed previously, commercial passenger transport is a competitive business requiring efficient operation. There is a desire to reduce the time and costs associated with mounting display devices. In addition, should a display device require repair or replacement, efficient operation requires that the repair or replacement be made as rapidly as possible so that the aircraft can be returned to service as soon as possible.

Furthermore, conventional designs have space inefficiencies. Space is required behind the monitor to permit one or more connectors from an electrical harness to be connected to the monitor. In particular, installation personnel must have sufficient room to reach behind each monitor as it is being installed to ensure secure electrical connections to the monitor.

The present invention addresses the foregoing drawbacks of conventional display device or monitor mounting arrangements by providing a mounting assembly permitting more rapid attachment and detachment of a display device, while securely holding the display device and preventing unauthorized detachment.

SUMMARY OF THE INVENTION

An assembly for mounting a display device in a vehicle is provided in which the display device includes a rear surface. In a preferred embodiment in accordance with the present invention, the assembly includes a mounting plate having opposite edges, a front surface extending therebetween, and a rear surface opposite the front surface. The mounting plate is mountable to the vehicle with the front surface of the mounting plate facing outward.

The assembly further includes a first locking mechanism disposed proximate one edge of the mounting plate and a second locking mechanism disposed proximate the other edge of the mounting plate. Each locking mechanism includes a jaw extending over the front surface of the mounting plate and pivotable between closed and open positions. Each jaw includes a resiliently deformable biasing member connected to the jaw and biasing the jaw towards the closed position.

In addition, the assembly includes an electrical connector attached to the mounting plate. The electrical connector has an opening for mating with another connector. The electrical connector is attached to the mounting plate with the opening of the connector exposed.

The mounting assembly includes a bracket structure disposed on the rear surface of the display device. The bracket structure includes a first edge engageable by one of the jaws and a second edge engageable by the other jaw when the rear surface of the display device is pressed against the front surface of the mounting plate.

The assembly further includes the foregoing another connector disposed on the display device at a position in which this another connector mates with the electrical connector of the mounting plate when the jaws engage the edges of the bracket structure. Preferably, the assembly includes at least one guide structure. The guide structure is composed of a pin extending from one of the mounting plate and the display device and a recess disposed on the other of the mounting plate and the recess in which the recess receives the guide pin therein when the another connector mates with the electrical connector.

In another aspect, a process or method is provided for detachably mounting a display device in a vehicle in which the display device includes a rear surface. In an embodiment in accordance with the invention, the method includes providing a mounting plate having opposite edges, a front surface extending therebetween, and a rear surface opposite the front surface.

The method further includes attaching first and second locking mechanisms to the mounting plate opposing one another. Each locking mechanism includes a jaw extending over the front surface of the mounting plate and pivotable between closed and open positions and biased to resiliently remain in the closed position. The method additionally includes providing on the mounting plate an electrical connector having an opening for mating with another connector and wiring for connecting to a power source, with the opening of the connector exposed from the front surface of the mounting plate. Thereafter, the method includes securing the mounting plate to the vehicle with the wiring of the electrical connector connected to a power source in the vehicle.

The method further includes providing a bracket structure on the rear surface of the display device, with the bracket structure including a pair of edges with one edge being engageable by the jaw of one of the locking mechanisms, and the other edge engageable by the jaw of the other locking mechanism. The method includes mounting the display device to the vehicle by pressing the one edge against the jaw of one of the locking mechanisms and the other edge against the jaw of the other locking mechanism until each jaw engages its respective edge of the bracket structure. The method also includes providing on the display device the another connector and mating the another connector with the electrical connector when the jaws engage the edges of the bracket structure.

More particularly, providing the display device with the another connector includes fixing this connector on the display device at a position opposing the opening of the electrical connector when each jaw is engaging its respective edge of the bracket structure. Hence, when the another connector is received in the opening of the electrical connector, the connectors mate or electrically connect with one another for passage of power and/or data between connectors.

The method provides for dismounting the display device after it has been mounted to the vehicle, i.e., the display device is detachably mounted. For detachment, the method includes providing on each of the jaws a release tab for releasing the jaw from engaging its respective edge of the bracket structure when the release tab is pressed. To prevent unauthorized dismounting or detaching of a display device, the method includes providing on the mounting plate a blocking tab extending between the release tab and the display device when each jaw engages its respective edge of the bracket structure. To detach or dismount the display device despite the presence of the blocking tabs, the method includes providing a release tool having an L-shaped member. According to the method, the L-shaped member is inserted between the blocking tab and the release tab for releasing a jaw from engagement of its respective edge of the bracket structure to dismount the display device after it has been mounted to the vehicle.

In another embodiment in accordance with the invention, an assembly for mounting a display device in a vehicle is disclosed, in which the display device has a rear surface. The mounting plate includes a front surface and a rear surface opposite the front surface in which the mounting plate is mountable to the vehicle with the front surface facing outward.

The assembly includes a locking mechanism supported by the mounting plate. The locking mechanism includes a jaw movable between latched and unlatched positions with the jaw biased to remain in the latched position. The locking mechanism also includes a release tab projecting from the locking mechanism which when the release tab is depressed, moves the jaw to the unlatched position.

The assembly further includes an electrical connector having an opening for mating with another connector. The electrical connector is attached to the mounting plate with the opening of the connector exposed.

The assembly includes a bracket structure disposed on the rear surface of the display device. The bracket structure includes an edge that is engaged by the jaw when the rear surface of the display device is placed in an engagement position by pressing the rear surface of the display device against the front surface of the mounting plate with the edge of the bracket structure pressing against the jaw to move the jaw to the unlatched position. When the display device reaches the engagement position, the jaw returns to the latched position due to bias thereof and engages the edge of the bracket structure.

The another connector is disposed on the display device at a position so that the another connector mates with the electrical connector when the display device is moved into the engagement position. To prevent unauthorized dismounting of the display device, the assembly includes a blocking tab projecting from the mounting plate in front of the release tab when the jaw engages the edge of the bracket structure.

For detachment or dismounting after mounting has been performed, the assembly includes a release tool. The release tool includes a portion or member having a bend in which the member is insertable between the blocking tab and the release tab when the jaw engages the edge of the bracket structure. This permits the release tab to be depressed with the tool.

In another aspect, the jaw includes a sloped surface against which the edge of the bracket structure is pressed. The slope facilitates moving the jaw to the unlatched position when moving the display device into the engagement position.

Other aspects and advantages will become apparent from the following description, taken in conjunction with the accompanying drawings, illustrating by way of example the principles of the invention.

BRIEF DESCRIPTION OF THE DRAWINGS

The drawing figures are not necessarily to scale and do not represent every feature, but are diagrammatic to enable those of ordinary skill in the art to make and use the invention without undue experimentation and do not limit the scope of the claims. Embodiments in accordance with the invention and advantages will therefore be understood by those of ordinary skill in the art by reference to the detailed description below together with the following drawings figures, wherein:

FIG. 7 illustrates an isometric view of the assembly and tool of FIG. 5 with part of the vehicle and the tool cut away; and FIG. 8 illustrates an enlarged portion of FIG. 7.

DETAILED DESCRIPTION OF THE PREFERRED EMBODIMENTS

Figure 1:
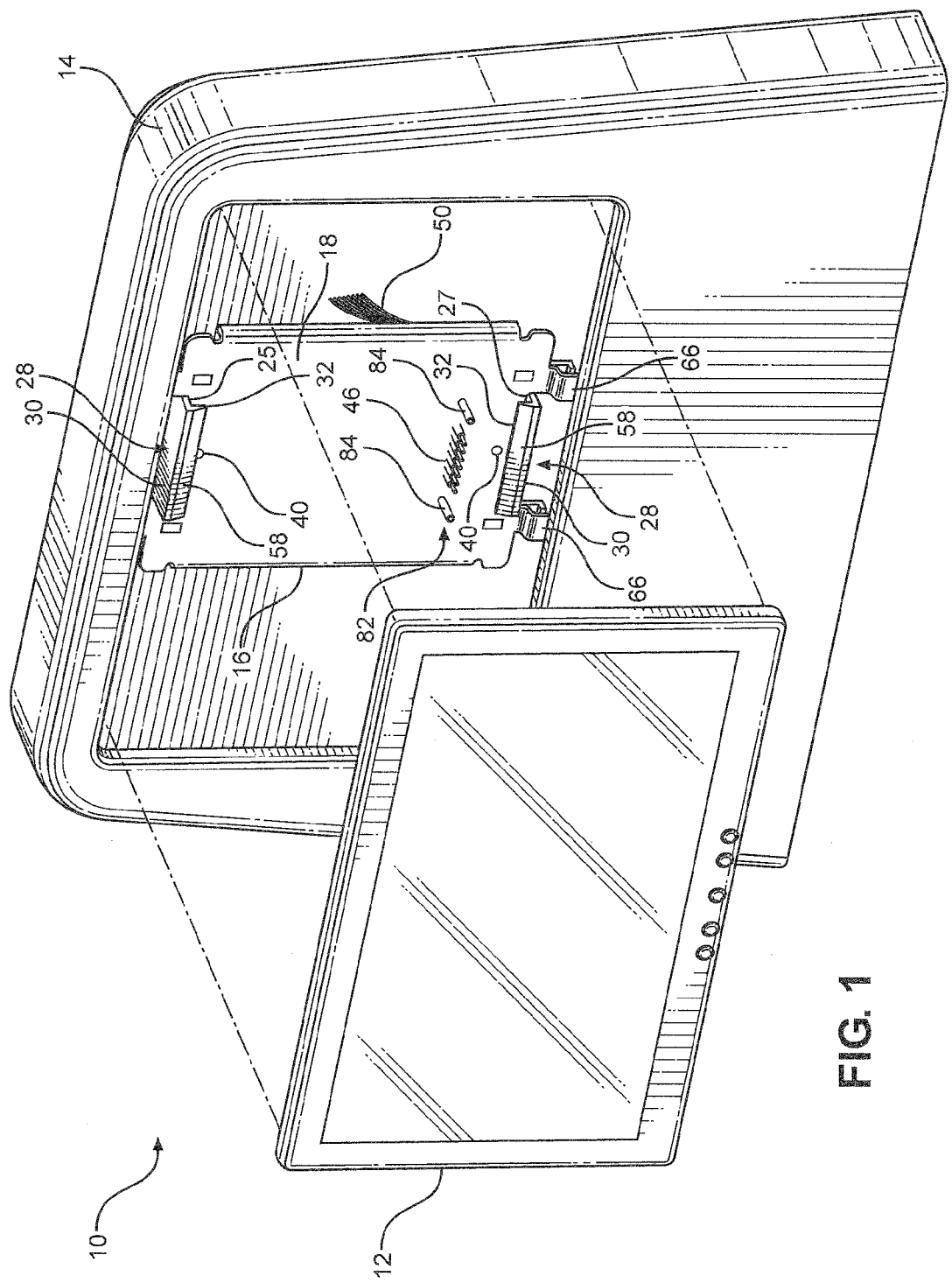
FIG. 1 illustrates a partially exploded isometric view of a preferred embodiment of an assembly for mounting a display device to a vehicle in accordance with the present invention.

FIG. 1 illustrates a preferred embodiment of an assembly, generally indicated by reference numeral 10, in accordance with the present invention. The assembly 10 is for mounting a display device 12 to a vehicle. FIG. 1 illustrates the assembly 10 being used to mount the display device 12 to the back of a seat 14 of the vehicle. However, the assembly 10 may be used to mount the display device 12 to other portions of the vehicle such as a wall or bulkhead of the vehicle.

Figure 3:
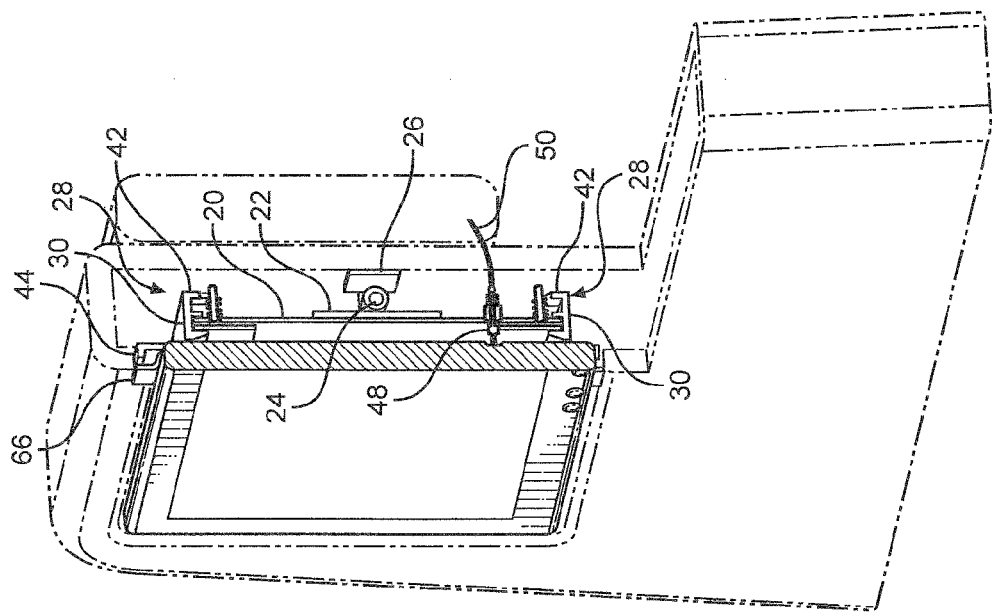
FIG. 3 illustrates an isometric view of the assembly of FIG. 1 with part of the assembly cut away after the display device has been mounted to the vehicle.

The assembly 10 includes a mounting plate 16 having a front surface 18 and a rear surface 20 (see FIGS. 3 and 4) opposite the front surface 16. The mounting plate 16 is secured to the vehicle by conventional methods. Preferably, the securing method is of a type permitting the mounting plate 16 to tilt or pivot such that when the display device 12 is mounted thereto the angle of the display device 12 may be adjusted to an optimum angle for a user. For example, an adapter plate 22 may be secured to the rear surface 20 of the mounting plate 16. The adapter plate 22 rotatably mounts to a rod or axle 24, which is supported by a base plate 26. The base plate 26 in turn fastens to the vehicle structure. Alternatively, if the display device 12 has a wide range of satisfactory viewing angles, the mounting plate 16 may be fixedly attached to the vehicle surface such that the mounting plate 16 is not capable of being independently tilted after being secured thereto. When the mounting plate 16 is secured to the vehicle, the front surface 18 of the mounting plate 16 faces outward for receiving the display device 12.

The mounting plate 16 includes opposite edges 25 and 27. The mounting plate 16 further includes at least one locking mechanism, indicated generally by reference numeral 28, mounted proximate one of the edges 25 or 27 of the mounting plate 16. Preferably, there is another locking mechanism 28 proximate the other edge 25 or 27 of the mounting plate 16.

Each locking mechanism 28 includes a jaw 30 extending over the front surface 18 of the mounting plate 16. In particular, the jaw 30 projects over its respective edge 25 or 27 of the mounting plate 16. Thereafter, a lip 32 projects parallel to the front surface 18 of the mounting plate 16 towards the lateral axis of the mounting plate 16.

Figure 4B:
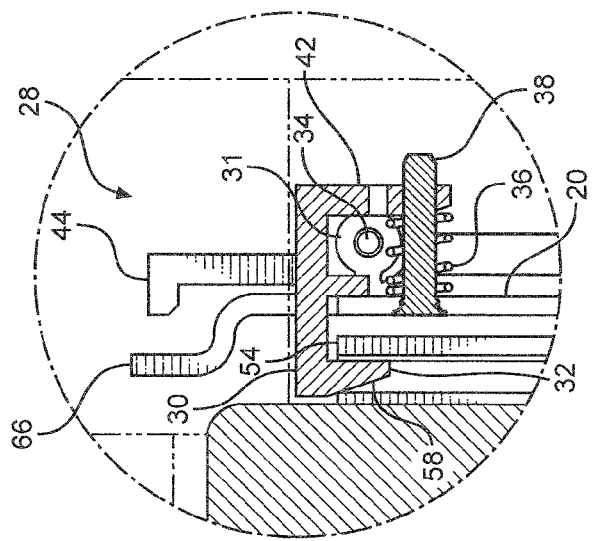
FIG. 4B illustrates an enlarged view of a portion of FIG. 4A.
Figure 4A:
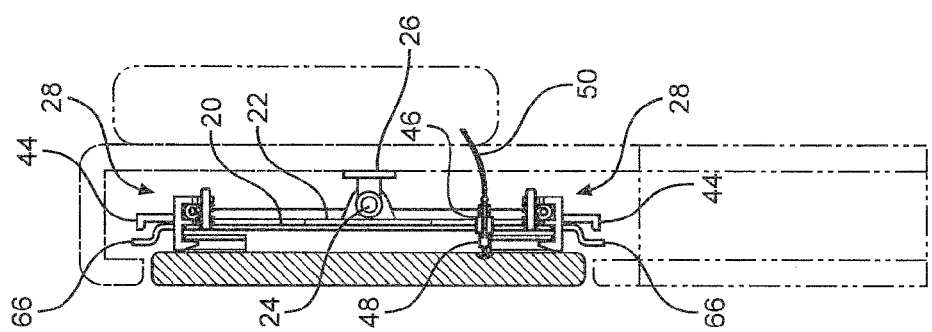
FIG. 4A illustrates a side view of the assembly of FIG. 1 with part of the assembly cut away after the display device has been mounted to the vehicle.

Each jaw 30 is supported by the mounting plate 16. In particular, each jaw 30 rotatably mounts to the rear surface 20 of the mounting plate 16. As shown in FIG. 4B, each jaw 30 is mounted to the rear surface 20 via a hinge 31. More particularly, the hinge 31 of each jaw rotatably mounts to an axle or pin 34 supported from the rear surface 20 of the mounting plate 16. The axles or pins 34 extend parallel to the rear surface 20 of the mounting plate 16.

Another pin 38 proximate each edge 25 and 27 of the mounting plate 16, extends orthogonally outward from the rear surface 20 of the mounting plate 16. The head 40 of each orthogonal pin 38 is visible from on the front surface 18 of the mounting plate 16 as can be seen in FIG. 1. Each jaw 30 includes a tooth 42. The tooth 42 extends from the jaw 30 parallel to the rear surface 20 of the mounting plate 16 and includes a recess corresponding to the shape of a capital letter U. The distal end of each orthogonal pin 38 is received in its respective U-shaped recess. A coil spring 36 is disposed around each orthogonal pin 38 and is resiliently compressed between the rear surface 20 of the mounting plate 16 and a tooth 42 of a jaw 30. The compression of the springs 36 resiliently biases each jaw 30 to remain in a closed or latched position. In alternative embodiments, a torsion spring may used instead, and mounted with the axle or pins 34 to which the jaws 30 mount.

The locking mechanisms 28 include a release tab 44. In particular, each jaw 30 includes a release tab 44 projecting orthogonally therefrom in a direction opposite the tooth 42 and lip 32 thereof. Pressing the release tab 44 rearward, rotates its respective jaw 30 away from the closed or latched position, i.e., toward the open or unlatched position. The release tabs 44 provide leverage for rotating the jaws 30 against the bias provide by the springs 36.

Figure 2:
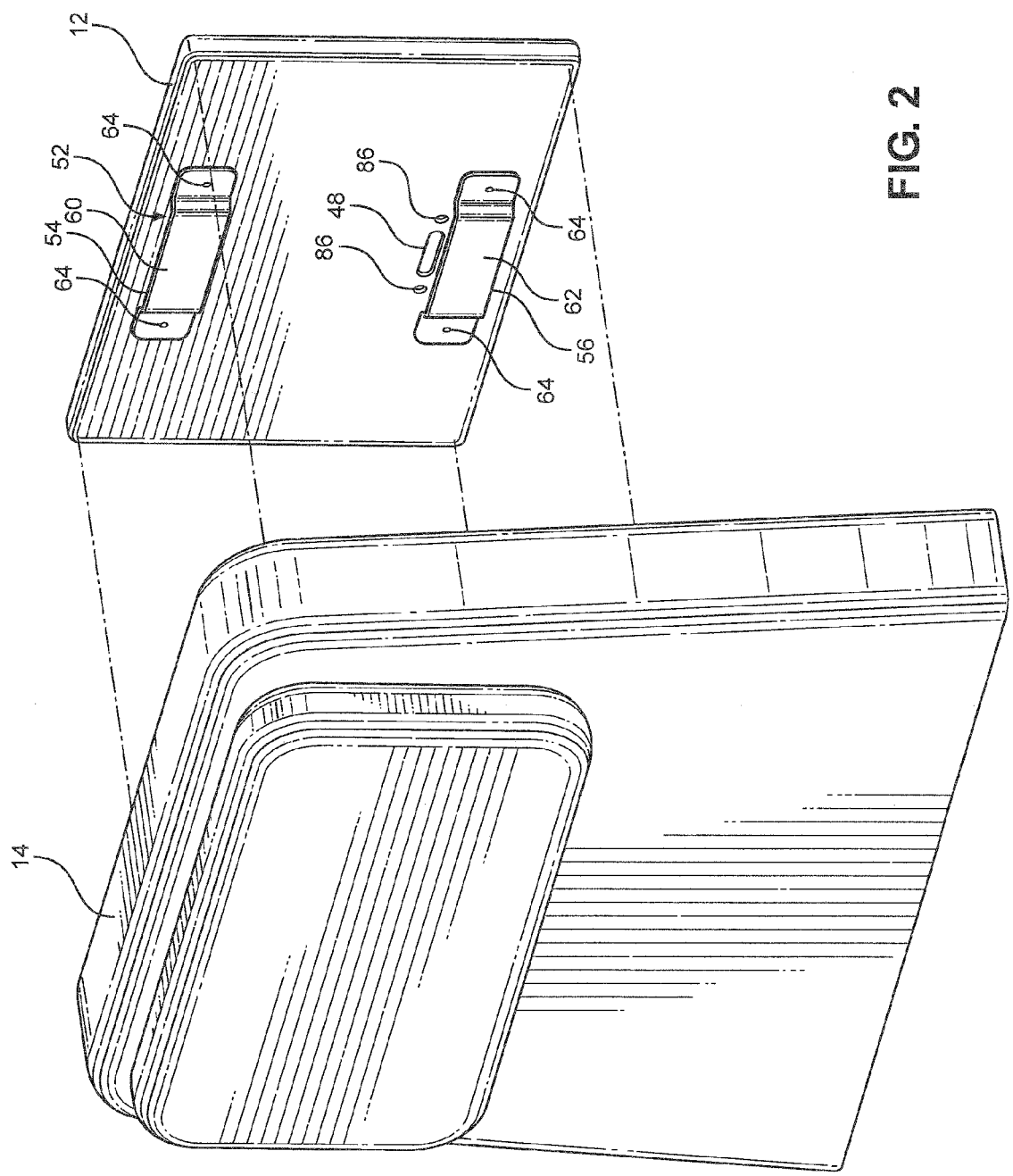
FIG. 2 illustrates an isometric view of the assembly of FIG. 1 from the opposite side of the assembly.

The mounting plate 16 includes an electrical connector 46 having an opening for mating with another connector 48 on the rear of the display device 12 (see FIG. 2). The electrical connector 46 includes wiring 50 leading from the opposite side in which the wiring 50 connects to sources of electrical power and/or data in the vehicle. The electrical connector 46 is attached to the mounting plate 16 with its opening exposed when the display device 12 is not attached. In particular, the connectors 44 and 48 are respectively disposed such that when the display device 12 mounts to the vehicle with the mounting assembly 10, the connectors 44 and 48 align and mate with one another.

The mounting assembly 10 includes a bracket structure indicated generally by reference numeral 52 in FIG. 2, disposed on the rear surface of the display device 12. The bracket structure includes upper and lower edges 54 and 56. One edge 54 of the bracket structure 52 is engaged by one of the locking mechanisms 28 and the other edge 56 is engaged by the other locking mechanism 28. In particular, the display device 12 is mounted to the mounting plate 16 by pressing the surface of the display device 12 against the front surface 20 of the mounting plate 16. More particularly, the upper edge 54 of the bracket structure 52 is pressed against the jaw 30 of the upper locking mechanism 28. Concurrently, the lower edge 56 of the bracket structure 52 is pressed against the jaw 30 of the other locking mechanism 28.

If sufficient pressing force is applied, the jaws 30 move toward the open or closed position. To facilitate movement of the jaws 30, each jaw 30 includes a sloped surface 58. In particular, the outer surface 58 of the lip 32 of each jaw 30 is beveled or sloped towards the lateral axis of the mounting plate 16. When the edges 54 and 56 of the bracket 52 are pressed against the sloped surfaces 58, there is a normal component of force generated against the sloped surface 58 that tends to rotate the jaws 30 toward the open position. This facilitates slipping the edges 54 and 56 of the bracket structure 52 past the lips 32 of the jaws 30 into engagement position.

When an edge 54 or 56 slips past the lip 32 of a jaw 30, the jaw 30 moves or rotates back into the closed or latched position due to the biasing force from its spring 36. The lip 32 of the jaw 30 slips behind the edge 54 or 56 of the bracket structure 52 and thereby engages the edge 54 or 56. This prevents the display device 12 from being dismounted until the jaw 30 is moved or rotated to the open or closed position.

The bracket structure 52 is illustrated in FIG. 2 as two separate brackets 60 and 62. The brackets 60 are 62 are each illustrated as fixed to the rear surface of the display device 12 by fasteners 64. In alternative embodiments, the bracket structure 52 may be a single larger bracket for providing the edges 54 and 56 for engagement by the locking mechanisms 28. Alternatively, the bracket structure 52 may be formed integrally in the rear surface of the display device 12. For example, a portion of the rear surface may be removed to form a recess under a bridge portion, in which a bridge or bridges provides the edges 54 and 56. In yet an alternative embodiment, the bracket structure may include ribs integrally formed with the rear surface of the display device 12 from which the ribs project from the rear surface and provide edges 54 and 56 for engagement by one or more locking mechanisms 28.

The previously described release tabs 44 facilitate dismounting the display device 12. That is, after the display device 12 has been mounted to the vehicle with the mounting assembly 10, the release tabs 44 may be depressed rearward to move the jaws 30 to the open or unlocked position. This permits the display device 12 to be readily detachable.

To prevent the display device 12 from being detached by an unauthorized person, the mounting plate 16 includes a blocking tab 66 corresponding to each release tab 44. Each blocking tab 66 projects parallel to the plane of the mounting plate 16 to a position in front of its respective release tab 44 when the display device 12 is mounted to the vehicle. The blocking tabs 66 are formed integrally with the mounting plate 16 by forming a recessed portion in the mounting plate 16, over which the jaws 30 extend. As can be seen most clearly in FIG. 4B, each blocking tab 66 includes a serpentine bend such that the distal end of the blocking tab 66 is offset relative to the proximal end. However, both the distal and proximal ends of each blocking tab 66 extend substantially parallel to the plane of the mounting plate 16. In alternative preferred embodiments, blocking tabs 66 may extend from the seat 14, instead of the mounting plate 16, to a position in front of the release tabs 44. The blocking tabs 66 make it difficult for someone to slide a thin object, such as credit card or ruler, between the edge of the display device 12 and the vehicle structure, to depress a release tab 44.

Figure 5:
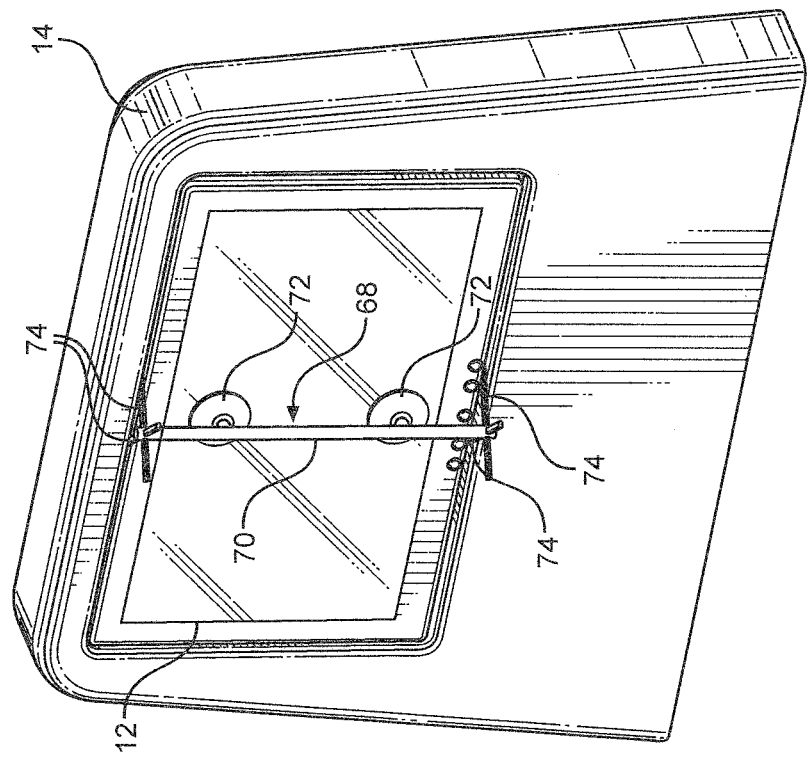
FIG. 5 illustrates the assembly of FIG. 1 after the display device has been mounted and a tool for dismounting the display device from the vehicle.

For this purpose, as indicated generally by reference numeral 68 in FIG. 5, a release tool is provided. The release tool 68 includes a rod 70 forming the main body of the tool. A pair of spaced-apart suction cups 72 extend from the rod 70 parallel to one another. Arms 74 extend from proximate each end of the rod 70. In use, the arms 74 are inserted between the display device 12 and the back of the seat 14, with the suction cups 72 facing the viewing surface of the display device 12. The suction cups 72 are formed of a soft or flexible elastomeric material and protect the viewing surface from damage by helping to prevent direct contact with harder surfaces of the tool 68. In this regard, the remainder of the tool 68 is formed of a harder material, albeit preferably a plastic material, that could damage or scratch the viewing surface of the display device 12.

Figure 6:
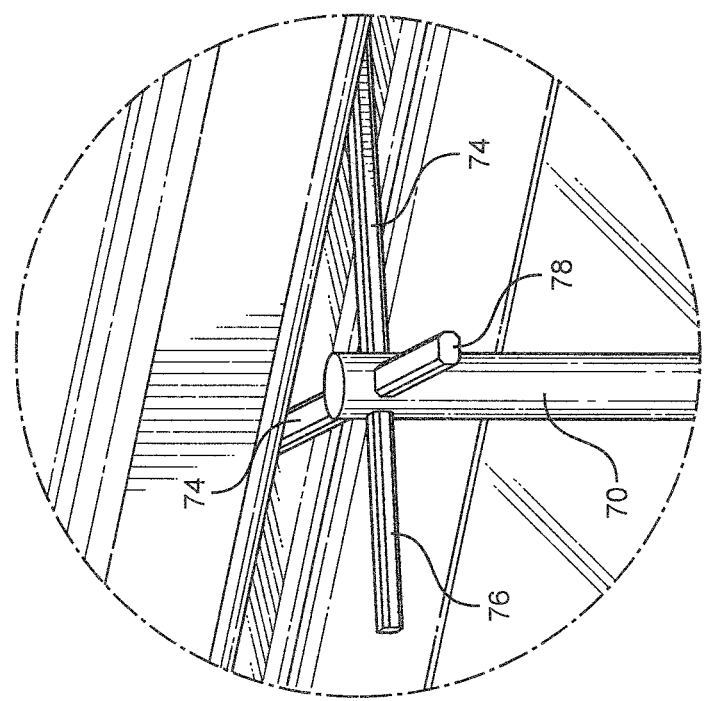
FIG. 6 illustrates an enlarged portion of FIG. 5.

As can be seen more clearly in FIG. 6, each arm 74 of a pair extends at an angle relative to the other arm 74 of that pair. Torsion handles 76 and 78 extend rearward from the main body 70 proximate each arm 74, substantially aligned with the longest longitudinal dimension of its respective arm 74. One torsion handle 78 at each end of the tool main body 70 is offset from its arm 74 along the length of the rod 70. FIGS. 7 and 8 show a partial cross section to more clearly illustrate the offset.

With continued reference to FIGS. 7 and 8, each arm 74 terminates at one end in an L-shaped member 80. The L-shaped geometry permits each of these members 78 to bend around a blocking tab 66 to make contact with the release tab 44 therebehind. When force is applied to the torsion handles 76 and 78 to rotate the handles toward one another, the arms 74 likewise rotate towards one another. In this state, the arms 74 are inserted between display device 12 and the back of the seat 14 for dismounting the display device 12. Thereafter, the force is removed and the arms 74 expand away from another such that the longer leg of each L-shaped member 80 passes behind a blocking tab 66. Hence, when the tool 68 is pressed forward, force is applied to each of the release tabs 44, which causes the jaws 30 to move to the unlatched or open position for dismounting the display device 12 from the mounting plate 18.

In alternative embodiments, the arms 74, tool main body 70, and other parts except for the suction cups 72, may be formed of a metal or metal alloy and have a scissor-like arrangement in which the arms 74 are rotatably mounted. In other alternative embodiments, rather than a tool 68 having four arms 74, a tool having a single arm with an L-shaped or bent member is provided for pressing against a single release tab 44, rather than all of the release tabs 44 simultaneously.

Returning to FIG. 1, the mounting assembly 10 preferably includes at least one guide structure, indicated generally by reference numeral 82 in the figure. The guide structure 82 includes at least one alignment or guide pin 84 and preferably a pair of pins 84 extending from the mounting plate 16. As shown in FIG. 2, corresponding recesses or guide holes 86 are formed in the rear of the display device 12. When the display device 12 is mounted to the mounting plate 16, the guide structure 82 helps to maintain alignment and prevent damage to the electrical connectors 46 and 48.

In alternative preferred embodiments, the guide pins 84 may be formed on the rear of the display device 12 and the recesses or guide holes on the mounting plate 16. In other alternative preferred embodiments, mating ribs and grooves may be employed instead of pins 84.

The components forming the mounting assembly 10 are preferably formed of a metal or metal alloy for greater durability and wear. Preferably a lightweight, economic metal or metal alloy is used, such as aluminum. Greater fuel savings are realized for a vehicle if weight is minimized for the mounting assembly 10. In alternative preferred embodiments, a hard plastic material may be used for the mounting assembly 10 for at least some components thereof. However, durability and reliability is not expected to be as great for plastic as with a metal material, although weight and cost will likely be lower than if metal or a metal alloy is used.

The drawing figures illustrate an embodiment having opposed locking mechanisms 28. Opposed locking mechanisms 28 make it easier to mount and dismount the display device 12 when it is located in a confined space, such as in a recess in the back of a seat 14. In alternative embodiments, a single locking mechanism 28 may be provided and an opposing lip near the other edge of the mounting plate 16 or possibly hooks. In this embodiment, the bracket structure 52 is first engaged with the opposing lip or hooks and then pressed against the jaw 30 of the single locking mechanism 28. The advantage of a single locking mechanism 28 embodiment is that it reduces costs.

If a single locking mechanism 28 is used with an opposing lip proximate the opposing edge, the electrical connector 46 could be mounted facing upward from the lip, toward the lateral axis of the mounting plate 16. Similarly, the other connector 48 on the display device 48 would be moved to the lower edge of the display device 12. The advantage of this arrangement is that the connectors 46 and 48 may be mated together first by lowering the display device 12 downward onto the lip and then pressing the upper edge of the display device 12 against the back of the seat 14 to engage the jaw 30. Hence, in this embodiment there is not a need to simultaneously mate the connectors 46 and 48 as the jaws 30 are engaged and thus mounting of the display device 12 is facilitated.

The described embodiments provide an advantage in that a display device 12 may be mounted with much less labor required, and also detached for replacement or repair, with much less required labor. Moreover, the embodiments help to prevent unauthorized detachment by requiring a release tool due to blocking tabs 66. Hence, the embodiments can be used for mounting display devices 12 to which the public has access, such as on commercial passenger aircraft, buses, trains, ferries, and other types of vehicles used for public transportation. The assembly 10 could also be used for mounting a display device 10 in a building for public access, such as at a kiosk.

Another advantage of the described embodiments is that it provides for "blind" mating of the electrical connectors 46 and 48. Due to the guide pins 84 and guide holes 86, installation personnel do not need to visually inspect the electrical connectors 46 and 48 for proper alignment as a display device 12 is being installed. The guide pins 84 and corresponding guide holes 86 provide for the required alignment of the electrical connectors 46 and 48 during installation. This also provides for greater space efficiency in that it is not necessary to provide additional space or room for installation personnel to reach behind a display device 12 during installation to mate electrical connectors extending from a harness. Hence, improvement in efficiency is provided with respect to both space and the time required for installation and/or maintenance.

Since changes can be made as described for alternative preferred embodiments, the present examples and embodiments are to be considered as illustrative and not restrictive and the invention is not to be limited to the details given herein, but may be modified within the scope and equivalence of the appended claims.

The invention claimed is:

1. An assembly for mounting a display device in a vehicle in which the display device has a rear surface, the assembly comprising:
   a mounting plate including opposite edges, a front surface extending therebetween, and a rear surface opposite the front surface in which the mounting plate is mountable to the vehicle with the front surface facing outward;
   a first locking mechanism disposed proximate one edge of the mounting plate and a second locking mechanism disposed proximate the other edge of the mounting plate, each locking mechanism including:
      a jaw extending over the front surface of the mounting plate and pivotable between closed and open positions;
      a resiliently deformable biasing member connected to the jaw and biasing the jaw towards the closed position; and
      a release tab projecting from each jaw and when the release tab is pressed in a direction opposite the biasing direction of the jaw, the jaw pivots toward the open position,
   an electrical connector having an opening for mating with another connector, the electrical connector being attached to the mounting plate with the opening of the connector exposed;
   a bracket structure disposed on the rear surface of the display device, the bracket structure including a first edge engageable by one of the jaws and a second edge engageable by the other jaw when the rear surface of the display device is pressed against the front surface of the mounting plate;
   the mounting plate includes a blocking tab projecting upward in front of the release tab when the jaws engage the bracket structure, and
   said another connector disposed on the display device at a position that said another connector mates with the electrical connector when the jaws engage the edges of the bracket structure.

2. The assembly of claim 1, further comprising at least one guide structure, the guide structure including a pin extending from one of the mounting plate and the display device and a recess disposed on the other of the mounting plate and the recess in which the recess receives the guide pin therein when said another connector mates with the electrical connector.

3. The assembly of claim 1, wherein the bracket structure includes a pair of brackets in which one bracket forms said first edge of said bracket structure and the other bracket forms said second edge of said bracket structure.

4. The assembly of claim 1, furthering comprising a release tool including a bent member insertable between the blocking tab and the release tab when the jaws engage the bracket structure for pressing the release tab.

5. The assembly of claim 1, wherein each locking mechanism includes a hinge attached to the rear surface of the mounting plate in which the jaw rotatably mounts via the hinge for providing pivotable movement of the jaw between the closed and open positions.

6. A method for releasably mounting a display device in a vehicle in which the display device includes a rear surface, the method comprising:
   providing a mounting plate including opposite edges, a front surface extending therebetween, and a rear surface opposite the front surface;
   attaching first and second locking mechanisms to the mounting plate opposing one another, with each locking mechanism including a jaw extending over the front surface of the mounting plate and pivotable between closed and open positions and biased to resiliently remain in the closed position;
   providing on the mounting plate an electrical connector having an opening for mating with another connector and wiring for connecting to a power source, with the opening of the connector exposed from the front surface of the mounting plate;
   securing the mounting plate to the vehicle with the wiring of the electrical connector connected to a power source in the vehicle;
   providing a bracket structure on the rear surface of the display device, with the bracket structure including a pair of edges with one edge being engageable by the jaw of one of the locking mechanisms, and the other edge engageable by the jaw of the other locking mechanism;
   providing on each of said jaws a release tab for releasing the jaw from engaging its respective edge of the bracket structure when the release tab is pressed;
   providing on said mounting plate a blocking tab extending between the release tab and the display device when each jaw engages its respective edge of the bracket structure;
   mounting the display device to the vehicle by pressing said one edge against the jaw of said one of the locking mechanisms and said other edge against the jaw of said other locking mechanism until each jaw engages its respective edge of the bracket structure; and providing on the display device said another connector and mating said another connector with the electrical connector during said mounting the display device.

7. The method of claim 6, wherein said providing on the display device includes fixing said another connector on the display device at a position opposing the opening of the electrical connector when each jaw is engaging its respective edge of the bracket structure such that said another connector is received in the opening of the electrical connector and mates therewith.

8. The method of claim 6, further comprising providing a guide pin on one of the mounting plate and the display device and providing a recess on the other of the mounting plate and the display device in which the guide pin is received in the recess when each jaw engages its respective edge of the bracket structure.

9. The method of claim 6, further comprising:
providing a release tool including an L-shaped member; and
inserting the L-shaped member between the blocking tab and the release tab for releasing a jaw from engagement of its respective edge of the bracket structure to dismount the display device after it has been mounted.

10. The method of claim 6, wherein said providing a bracket structure includes fixing a pair of brackets on the display device.

11. An assembly for mounting a display device in a vehicle in which the display device has a rear surface, the assembly comprising:
a mounting plate including a front surface and a rear surface opposite the front surface in which the mounting plate is mountable to the vehicle with the front surface facing outward;
a locking mechanism supported by the mounting plate, the locking mechanism including:
a jaw movable between latched and unlatched positions with the jaw biased to remain in the latched position;
a release tab projecting from the locking mechanism which when the release tab is depressed, moves the jaw to the unlatched position;
an electrical connector having an opening for mating with another connector, the electrical connector being attached to the mounting plate with the opening of the connector exposed;
a bracket structure disposed on the rear surface of the display device, the bracket structure including an edge that is engaged by the jaw when the rear surface of the display device is placed in an engagement position by pressing the rear surface of the display device against the front surface of the mounting plate with the edge of the bracket structure pressing against the jaw to move the jaw to the unlatched position and when the display device reaches the engagement position, the jaw returns to the latched position due to bias thereof and engages the edge of the bracket structure;
said another connector disposed on the display device at a position that said another connector mates with the electrical connector when the display device is moved into the engagement position; and
a blocking tab projecting from the mounting plate in front of the release tab when the jaw engages the edge of the bracket structure.

12. The assembly of claim 11, furthering comprising a release tool including a member having a bend in which the member is insertable between the blocking tab and the release tab when the jaw engages the edge of the bracket structure for depressing the release tab.

13. The assembly of claim 11, wherein the bracket structure includes another edge, the assembly further comprising another locking mechanism supported by the mounting plate and including a jaw movable between latched and unlatched positions with the jaw biased to remain in the latched position, and when the display device is in the engaged position, the jaw of one locking mechanism engages one edge of the bracket structure and the jaw of the other locking mechanism engages the other edge of the bracket structure.

14. The assembly of claim 13, wherein the another locking mechanism includes a release tab projecting from the another locking mechanism and when the release tab is depressed the jaw of the another locking mechanism moves to the unlatched position.

15. The assembly of claim 11, wherein the jaw includes a sloped surface against which the edge of the bracket structure is pressed to facilitate moving the jaw to the unlatched position when moving the display device into the engagement position.

16. The assembly of claim 11, further comprising at least one guide structure, the guide structure including a pin extending from one of the mounting plate and the display device and a recess disposed on the other of the mounting plate and the recess in which the recess receives the guide pin therein when said another connector mates with the electrical connector.

* * * * *